United States Patent [19]

Okamoto et al.

[11] Patent Number: 5,787,105

[45] Date of Patent: Jul. 28, 1998

[54] INTEGRATED SEMICONDUCTOR LASER APPARATUS

[75] Inventors: Kazuya Okamoto; Atsushi Yamada, both of Kanagawa-ken; Yoshiaki Nakano, Tokyo; Kunio Tada, Saitama-Ken, all of Japan

[73] Assignee: Nikon Corporation, Tokyo, Japan

[21] Appl. No.: 589,125

[22] Filed: Jan. 22, 1996

[30] Foreign Application Priority Data

Jan. 20, 1995 [JP] Japan ................................ 7-007741

[51] Int. Cl.$^6$ ........................................................ H01S 3/19
[52] U.S. Cl. ........................... 372/50; 372/96; 385/50; 385/37; 385/131
[58] Field of Search ........................ 372/50, 96, 46; 385/50, 131, 37

[56] References Cited

U.S. PATENT DOCUMENTS

| | | | |
|---|---|---|---|
| 4,656,636 | 4/1987 | Amann et al. | 372/50 |
| 4,691,214 | 9/1987 | Hayakawa et al. | 372/50 |
| 5,140,149 | 8/1992 | Sakata et al. | 372/50 |
| 5,349,598 | 9/1994 | Ouchi et al. | 372/50 |
| 5,444,730 | 8/1995 | Mizutani | 372/50 |

FOREIGN PATENT DOCUMENTS

| | | | |
|---|---|---|---|
| 1-286487 | 11/1989 | Japan | 372/46 |
| 2-007489 | 1/1990 | Japan | 372/46 |

OTHER PUBLICATIONS

"Multiple Electrode Chirped Grating Tunable Distributed Feedback Laser".

Nong Chen et al., Extended Abstracts of the 1993 International Conference on Solid State Devices and Materials, Makuhari, 1993, pp. 150–152. (No month available).

"Fabrication and Characteristics of an Integrated DFB Laser/Amplifier . . . Tilted End Facets".

Yoshiaki Nakano et al., Jap. Jour. of Appl. Phys., vol. 29, No. 12, Dec. 1990, pp. 153–156.

Okamoto et al., "Design and Fabrication Monolitically Integrated Lateral–Electrode Etched Mirror Laser With Y-Branch Single–Mode Waveguide in GaAs/AlGaAs", *Jpn. J. Appl. Phys.*, vol. 34:4809–4814, Sep. 1995.

Okamoto et al., "Monolithic Integration of Lateral–Electrode Laser and Waveguide Devices in GaAs/AlGaAs", *IEEE Lasers and Electro–Optics Society 1995 Annual Meeting*, pp. 105–106. No month available.

LUO et al., "Fabrication and Characteristics of Gain–Coupled Distributed Feedback Semiconductor Lasers With a Corrugated Active Layer", *IEEE Journal of Quantum Electronics*, vol. 27(6): 91–98, Jun. (1991).

Yamada et al., "A Study of Evanescent–Field Coupling Between DFB Laser and Waveguide Using Coupled–Mode Theory", pp. 101–106, Jun. (1995).

Okamoto et al., "Monolithic Intergration of Lateral–Electrode Etched–Mirror Laser and Single–Mode Waveguide Devices in GaAs/AlGaAs", pp. 85–92, Jun. (1995).

Okamoto et al., "Characterization of P–and N–Type Impurity Diffusions in GaAs from Doped Silica Films", *Jpn. J. App. Phys.*, vol. 34:1127–1134, (1995). No month available.

Okamoto et al., "Open–Tube Diffusion in GaAs Using Zinc–and Tin–Doped Spin–on Silica Films", *Control of Semiconductor Interfaces*, pp. 525–530, (1994) (No month Available).

*Primary Examiner*—Rodney B. Bovernick
*Assistant Examiner*—Yisun Song
*Attorney, Agent, or Firm*—Foley & Lardner

[57] ABSTRACT

An integrated semiconductor laser apparatus is constructed in such an arrangement that a core layer is located in the proximity of an active layer so as to be in an evanescent-field area of light propagating in the active layer and that a carrier concentration of a second cladding layer is higher than that of a first cladding layer. Thus, most evanescent waves of light propagating in the core layer propagate in the first cladding layer of the low carrier concentration. Since the rate of evanescent waves absorbed by carriers is very low, the integrated semiconductor laser apparatus can propagate the light with small losses.

13 Claims, 13 Drawing Sheets

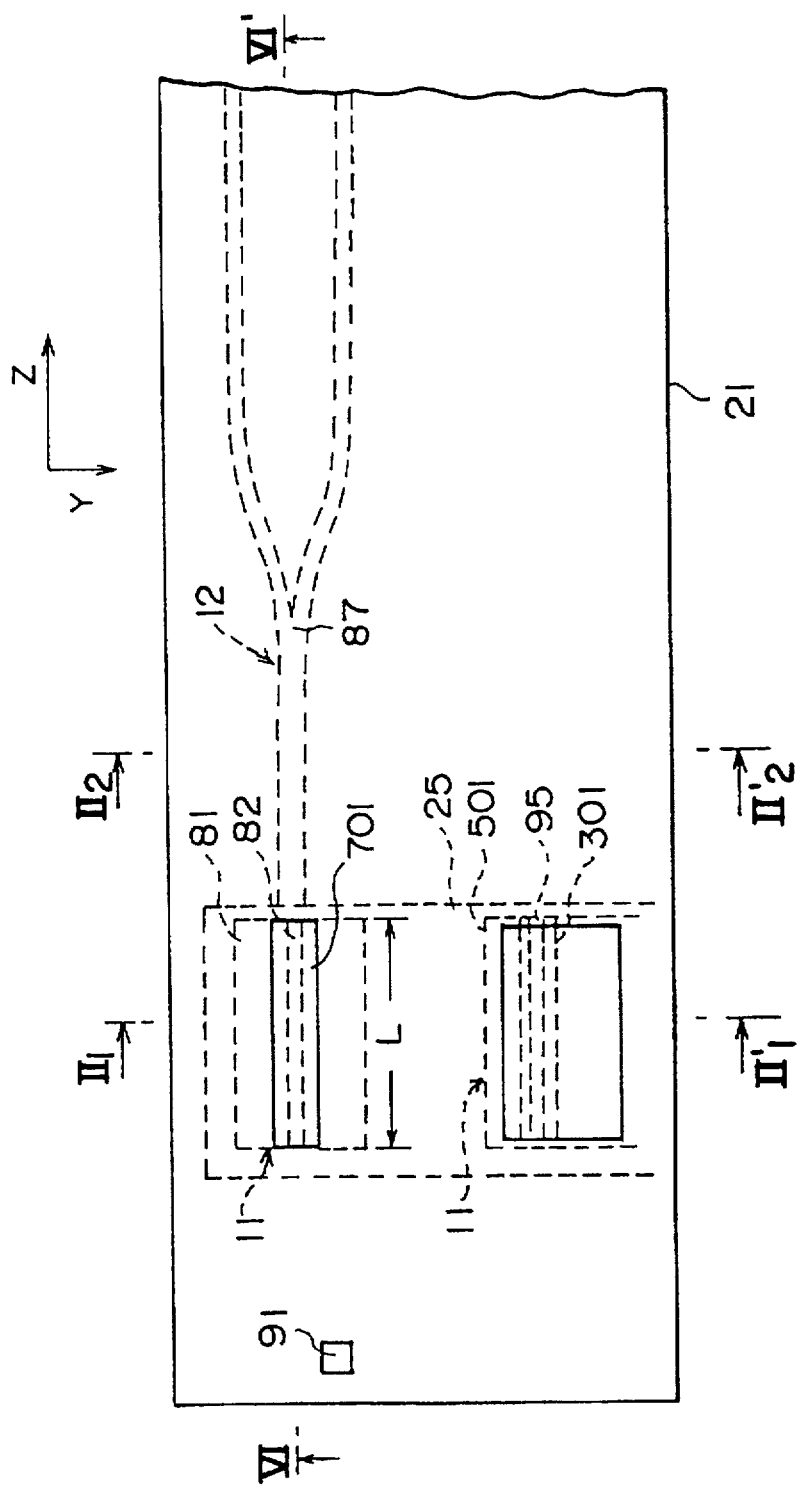

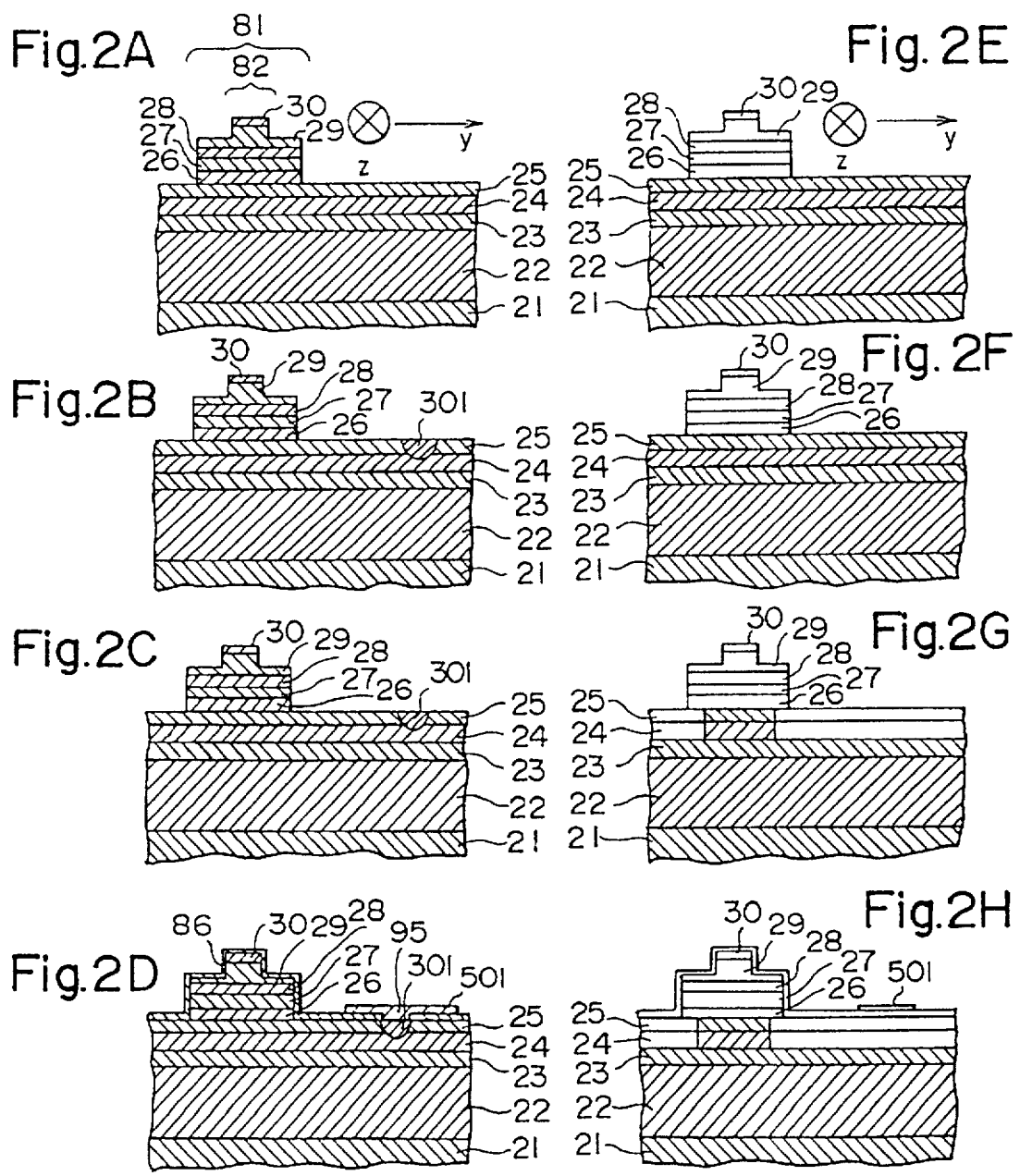

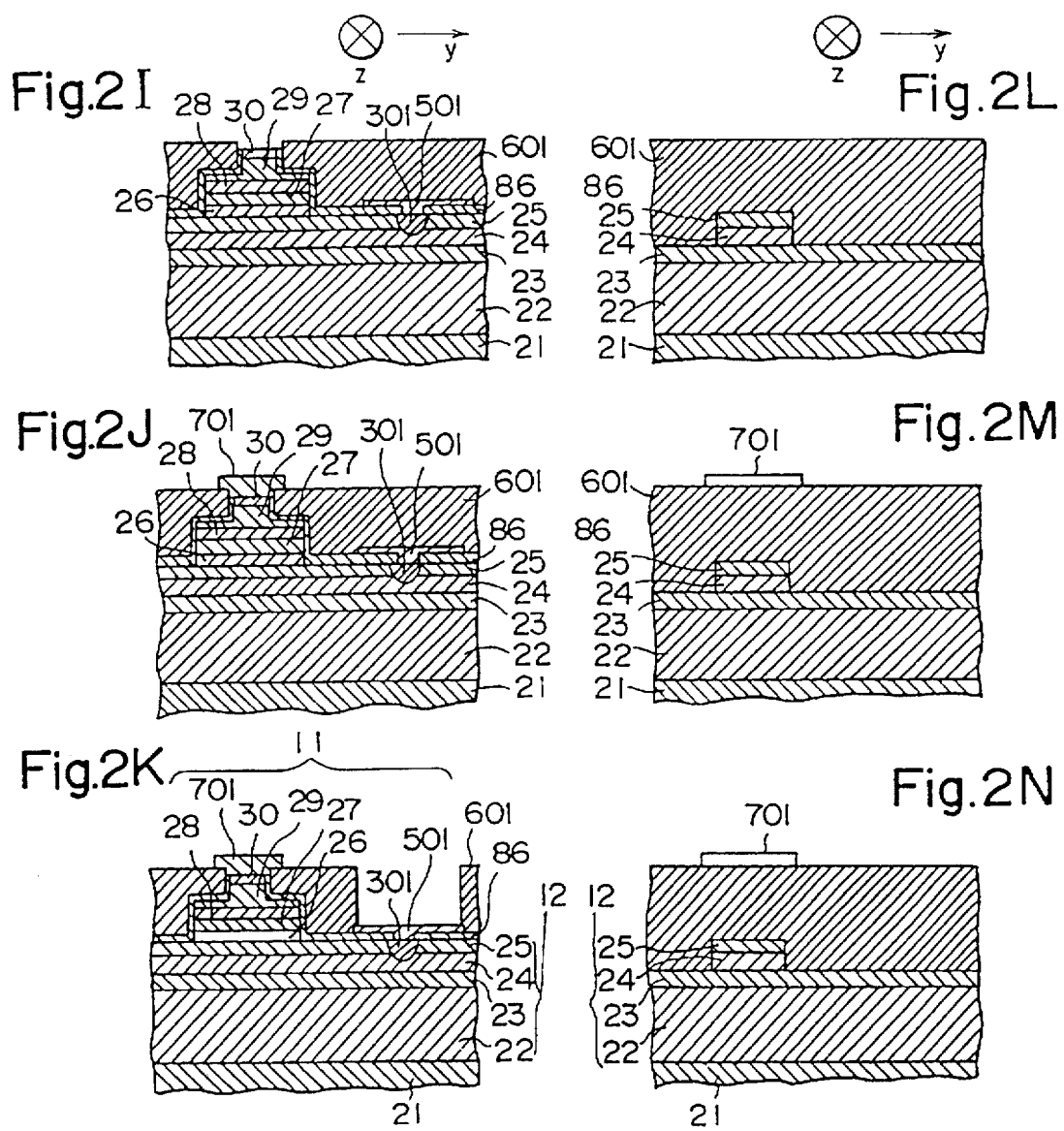

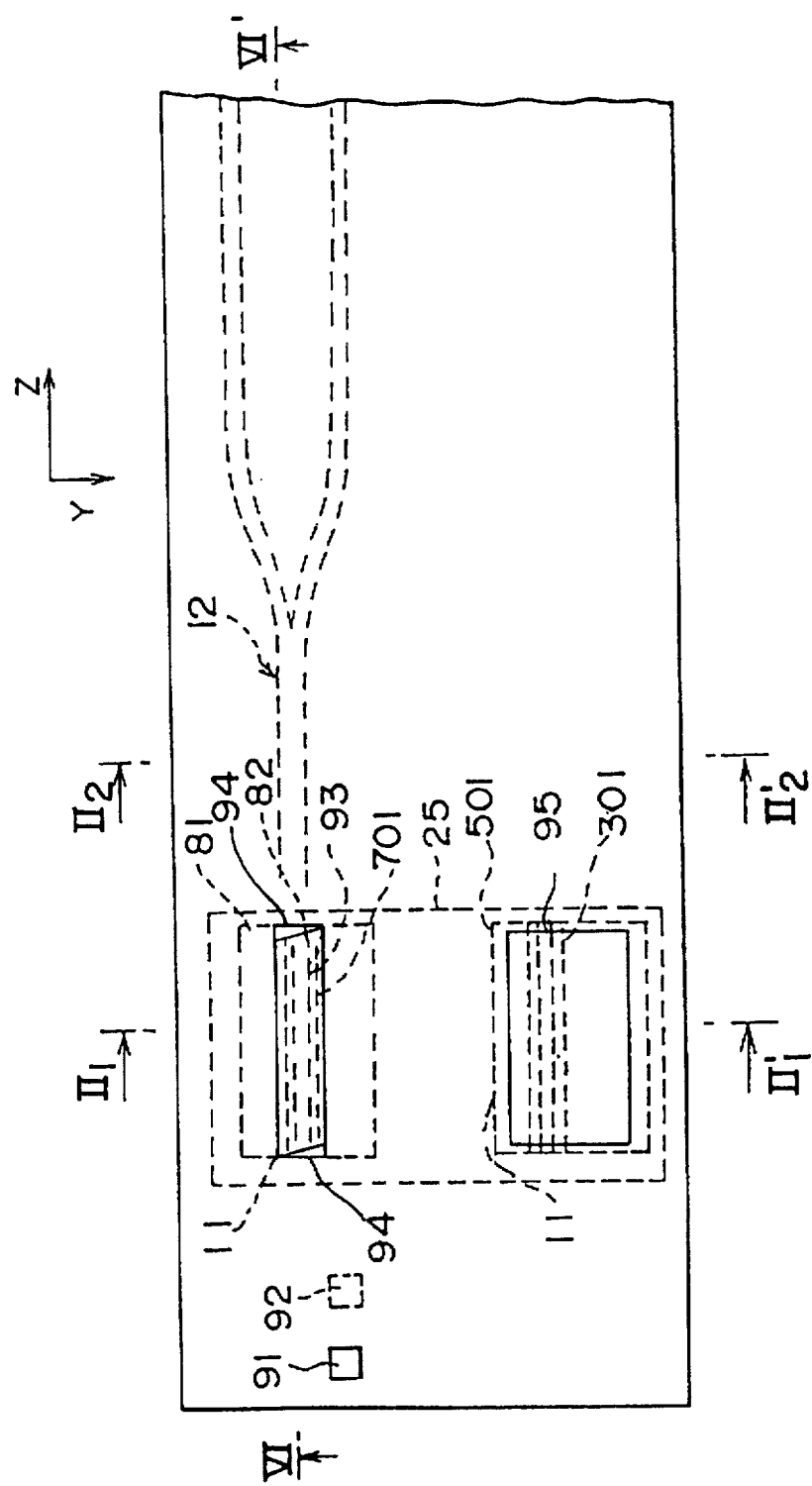

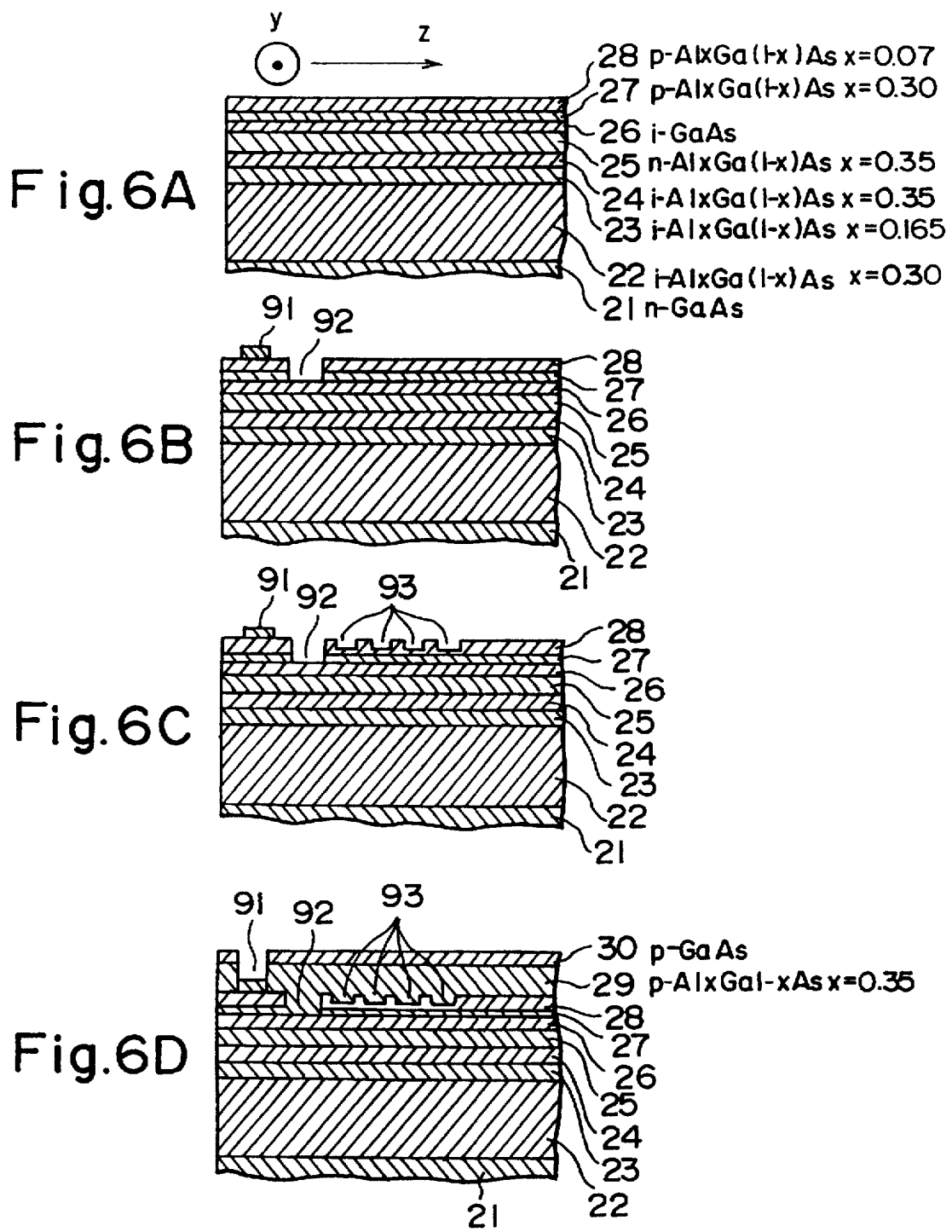

INTEGRATED SEMICONDUCTOR LASER APPARATUS

BACKGROUND OF THE INVENTION

1. Field of the Invention

The present invention relates to integrated semiconductor laser apparatus, and more particularly to integrated semiconductor laser apparatus used in optical fiber communications, optical measurements, etc.

2. Related Background Art

Integration of optical devices can contribute to development of optical arrangement of optical fiber communication network and optical measurement system in various respects, for example, compactification of system, development of highly-reliable system, development of low-power system, development of high-performance system, development of low-price system, and so on.

The technology reported heretofore as practically usable includes waveguide type optical integrated devices using a silica-base glass waveguide or a lithium niobate substrate (LiNbO₃). These devices are, however, of a so-called hybrid integrated type in which a light source such as a laser, and a light-receiving device are external devices, which is outside the scope of perfect optical arrangement of system.

A waveguide type optical integrated device using a compound semiconductor substrate is also reported as one to overcome the above problem. In this case, one of the most important techniques is optical interconnection between an optical-device such as a laser and a waveguide. Typical examples of the connecting method are the three types as shown in FIGS. 12A–12C.

The first method is a butt coupling method for directly connecting end faces of devices with each other by epitaxy (crystal growth) (as shown in FIG. 12A). In this method, light emerging from a laser active layer 2001 is incident into a waveguide layer 2002 through a butting end face 2003.

The second method is a phase matching coupling method (as shown in FIG. 12B). In the structure shown in FIG. 12B, guided light travels back and forth on a periodic basis between the laser active layer 2001 and the coupled waveguide 2002, which enables 100% coupling of laser oscillation light to the waveguide by matching the length of the laser active layer with the complete coupling length.

The third method is an evanescent-field coupling method (as shown in FIG. 12C). In the case of this method, the configuration thereof is similar to that of the above phase matching method (FIG. 12B), but the third method is substantially different from the above phase matching method in that the laser active layer 2001 and the waveguide layer 2002 are proximate enough to each other to compose a two-mode waveguide as a whole. Since two mode beams interfere with each other and light travels back and forth between the laser active layer 2001 and the waveguide layer 2002, the laser oscillation light can be coupled to the waveguide by matching the length of the laser active layer with the complete coupling length.

FIG. 13 is a perspective view to show an example using the butt coupling method of FIG. 12A, which shows a monolithic optical integrated circuit (optical IC) for heterodyne signal reception in coherent optical communication. This circuit uses an InP type semiconductor for substrate 2012, where not only the light source (DFB laser) 2013 and light-receiving devices 2014, but also optical devices such as 3 dB couplers 2016 of a directional coupler type are integrated in the circuit. These devices are coupled by butt coupling portions 2015, and the light travels through the butt coupling portions 2015 to the devices coupled thereby.

However, the monolithic optical IC for heterodyne signal reception as shown in FIG. 13 requires at least three epitaxial steps for fabrication thereof. Since the butt coupling method was employed for optical interconnection between the laser active layer and the waveguide layer and between the waveguide layer and the light-receiving device, it was extremely difficult to attain interconnection between these devices at high accuracy, with good reproducibility, and in a simple and easy manner. It was also very difficult to determine the shape of a $SiO_2$ mask for selective epitaxy necessary for butt coupling, to smooth the coupling portions, and to optimize the epitaxial conditions, etc., and these factors lowered the yield of devices.

Recently reported was a high-efficiency butt coupling method utilizing a combination of the $SiO_2$ mask with the metal organic vapor phase epitaxy (MOVPE) process, which effectively uses the characteristics of epitaxy and which does not necessitate alignment (M. Aoki et al.: IEEE Photonics Technol. Lett. 48 (1992) 580). Since this method utilizes the face orientation of crystal, it is difficult to apply it to all of various waveguide layouts, and applications thereof are substantially limited.

Meanwhile, the phase matching method and evanescent-field coupling method as discussed above are disclosed in Suematsu et al., Japanese Patent Publication No. 56-38075.

Since the waveguide layer coexists with the laser area, as discussed above, in the invention as disclosed in this Japanese Patent Publication No. 56-38075, it is necessary to dope the waveguide itself with impurities in order to achieve low resistance of the laser cladding layer. Thus, good characteristics as an optical integrated circuit could not be expected by these methods because the impurity-doped waveguide had great propagation losses of waveguide due to light absorption by free carriers.

Further, the phase matching method had another problem that there were limitations on the compound compositions of epitaxially grown layers in order to achieve matching between the complete coupling length and the length of laser resonator.

SUMMARY OF THE INVENTION

An object of the present invention is to provide an integrated semiconductor laser in a simple structure capable of coupling light of semiconductor laser with an optical waveguide at high efficiency and propagating the light at high efficiency.

One aspect of the present invention is an integrated semiconductor laser apparatus comprising:

an active layer for radiating light;

a core layer for propagating the light radiated in the active layer;

a first cladding layer disposed between the active layer and the core layer and in the proximity of the core layer;

a second cladding layer disposed between the active layer and the first cladding layer; and a pair of electrodes for producing an electric current flow in the active layer;

wherein the core layer is located in the proximity of the active layer so as to be in an evanescent-field area of the light propagating in the active layer and wherein a carrier concentration of the second cladding layer is higher than a carrier concentration of the first cladding layer.

Another aspect of the present invention is an integrated semiconductor laser apparatus comprising:

an active layer for radiating light;

a core layer for propagating the light radiated in the active layer;

a first cladding layer disposed between the active layer and the core layer and in the proximity of the core layer;

a second cladding layer disposed between the active layer and the first cladding layer;

a first electrode located in a part of the second cladding layer;

a third cladding layer located so that the active layer is placed between the second cladding layer and the third cladding layer;

a second electrode located so that the third cladding layer is placed between the active layer and the second electrode; and a diffraction-grating-formed layer located between the active layer and the third cladding layer;

wherein the core layer is located in the proximity of the active layer so as to be in an evanescent-field area of the light propagating in the active layer, a carrier concentration of the second cladding layer is higher than a carrier concentration of the first cladding layer, and the first electrode and second electrode are arranged in a lateral direction to each other.

Still another aspect of the present invention is an integrated semiconductor laser apparatus comprising:

an active layer for radiating light;

a core layer for propagating the light radiated in the active layer;

a first cladding layer disposed in the proximity of the core layer between the active layer and the core layer;

a second cladding layer disposed between the active layer and the first cladding layer;

a pair of electrodes for letting an electric current flow in the active layer; and a pattern-formed layer located between the active layer and the second cladding layer;

wherein the core layer is located in the proximity of the active layer so as to be in an evanescent-field area of the light propagating in the active layer and wherein a carrier concentration of the second cladding layer is higher than a carrier concentration of the first cladding layer.

In the integrated semiconductor laser apparatus of the present invention, as the light occurring in the active layer propagates in the active layer and the core layer, it is coupled by evanescent-field coupling with the core layer to propagate in the core layer. In this arrangement, the cladding layer has the second cladding of the high carrier concentration and the first cladding of the low carrier concentration. Since the first cladding is located on the core layer side, most of evanescent waves of the light propagating in the core layer propagate in the first cladding layer of the low carrier concentration. This results in decreasing the rate of evanescent waves absorbed by carriers, whereby the integrated semiconductor lasers of the above aspects can propagate the light as keeping losses low.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is a plan view to show an integrated semiconductor laser apparatus according to Embodiment 1 of the present invention;

FIGS. 2A to 2N are sectional views of the integrated semiconductor laser apparatus shown in FIG. 1;

FIG. 5 is a plan view to show another integrated semiconductor laser apparatus according to Embodiment 2 of the present invention;

FIGS. 6A to 6D are sectional views of the integrated semiconductor laser apparatus shown in FIG. 5;

DESCRIPTION OF THE PREFERRED EMBODIMENTS

Figure 3:
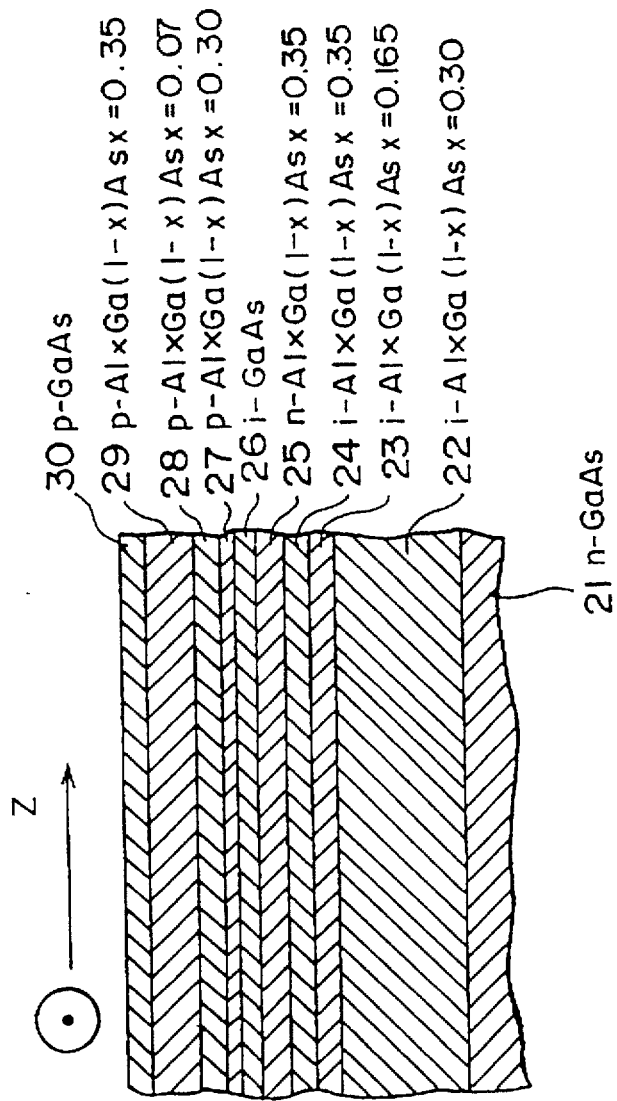
FIG. 3 is a sectional view of the integrated semiconductor laser apparatus shown in FIG. 1.

The embodiments of the integrated semiconductor laser according to the present invention will be explained with reference to the drawings. In the drawings, same reference numerals denote same or equivalent portions, and redundant description will be omitted.

Embodiment 1

FIG. 1 is a plan view to show the integrated semiconductor laser apparatus according to Embodiment 1 of the present invention, and FIG. 2A to FIG. 3 are cross sections of the integrated semiconductor laser apparatus shown in FIG. 1. FIGS. 2A–2D and 2I–2K are cross sections taken along line $II_1$–$II_1'$ in FIG. 1, FIGS. 2E–2H and 2L–2N are cross sections taken along line $II_2$–$II_2'$ FIG. 1, and FIG. 3 is a sectional view taken along VI–VI' line in FIG. 1.

In these drawings, there are a semiconductor laser 11 and a Y-branched waveguide 12 formed on a substrate 21. Specifically, as shown in FIG. 2K, the waveguide 12 is placed on the substrate 21, and the semiconductor laser 11 is formed on the waveguide 12.

The waveguide 12 is shaped in a planar type waveguide below the semiconductor laser 11 and in a loaded type single-mode waveguide in which the cladding is processed in the waveguide shape, as shown in FIG. 2N, in the other portions than below the semiconductor laser 11. The semiconductor laser 11 is a Fabry-Perot laser formed of etching mirrors. The semiconductor laser 11 and waveguide 12 are formed so as to be coupled with each other by evanescent-field coupling.

The substrate 21 applied herein is an n-GaAs substrate, the crystal orientation of which is determined so that the propagating direction of light may be aligned with the orientation <−110> (where −1 means 1 accompanied with an over line). The waveguide 12 is formed by laminating four layers of lower cladding layer 22, core layer 23, upper first cladding layer 24, and upper second cladding layer 25 in order from the side of substrate 21 thereon.

The lower cladding layer 22 is a non-doped $Al_xGa_{1-x}As$ (x=0.3) layer about 2.0 μm thick, and the core layer 23 is a non-doped $Al_xGa_{1-x}As$ (x=0.165) layer 0.45 μm thick. Further, the upper first cladding layer 24 is a non-doped (n-type carrier concentration: $1\times10^{15}$ cm$^{-3}$ or less) $Al_xGa_{1-x}As$ (x=0.35) layer 0.3 μm thick. The upper second cladding layer 25 is an n$^-$-doped (n-type carrier concentration: $5\times10^{17}$ cm$^{-3}$) $Al_xGa_{1-x}As$ (x=0.35) layer 0.3 μm thick. The carrier concentration of the upper second cladding layer 25 is preferably between $1\times10^{17}$ cm$^{-3}$ and $1\times10^{18}$ cm$^{-3}$.

As described, the upper second cladding layer 25 is the only one made of a doped material in the structure of the waveguide 12, and the upper second cladding layer 25 also serves as an n-type layer in the pin structure of the semiconductor laser 11. As shown in FIG. 2N, the upper first cladding layer 24 and upper second cladding layer 25 are processed in the shape of the Y-branched waveguide 4 μm wide in the other portions than below the semiconductor laser 11.

The semiconductor laser 11 is composed of the upper second cladding layer 25 used in common to the waveguide 12, layers of laser active layer 26, laser barrier layer 27, laser guide layer 28, laser cladding layer 29, and laser cap layer 30 laminated in the stated order on the upper second cladding layer 25, a first electrode 501, a second electrode 701, and an n-type-impurity-doped area 301 which is an impurity diffusion area. It is noted that no problem would arise without including the laser barrier layer 27 and laser guide layer 28.

The (laser) active layer 26, laser barrier layer 27, laser guide layer 28, laser cladding layer 29, and laser cap layer 30 are formed only in a partial laser mesa area 81 (FIG. 1) above the upper second cladding layer 25. The laser cladding layer 29 and laser cap layer 30 are processed in a shape of a laser stripe portion 82 for narrowing of injection current. The n-type-impurity-doped area 301 is located at a position on the upper second cladding layer 25 and adjacent to the laser mesa area 81.

The laser active layer 26 is a non-doped GaAs layer 0.1 μm thick. The laser barrier layer 27 is an $Al_xGa_{1-x}As$ (x=0.30) layer 0.1 μm thick, and the laser guide layer 28 is an $Al_xGa_{1-x}As$ (x=0.07) layer 0.15 μm thick. These layers both are p$^-$-doped (p-type carrier concentration: $5\times10^{17}$ cm$^{-3}$). The laser cladding layer 29 is a p$^-$-doped (p-type carrier concentration: $5\times10^{17}$ cm$^{-3}$) $Al_xGa_{1-x}As$ (x=0.35) layer 0.7 μm thick. The laser cap layer 30 is a p$^+$-doped (p-type carrier concentration: $5\times10^{18}$ cm$^{-3}$) GaAs layer 0.3 μm thick.

The n-type-impurity-doped area 301 is an area obtained by diffusing Sn, which has the depth of about 0.3 μm or less, and the n-type carrier concentration of its surface portion is $1\times10^{18}$ cm$^{-3}$. For electric insulation an oxide film 86 and polyimide 601 cover surfaces of the semiconductor laser 11 and waveguide 12 except for the portions of electrodes 701, 501.

In the above structure, the thicknesses of the first cladding layer 24 and second cladding layer 25 are determined so that the core layer 23 in the waveguide may be located inside the evanescent-field area of light radiated in the laser active layer 26 of the semiconductor laser 11. A distance between the active layer and the core layer is preferably within 2 μm in this AlGaAs/GaAs system.

Figure 4:
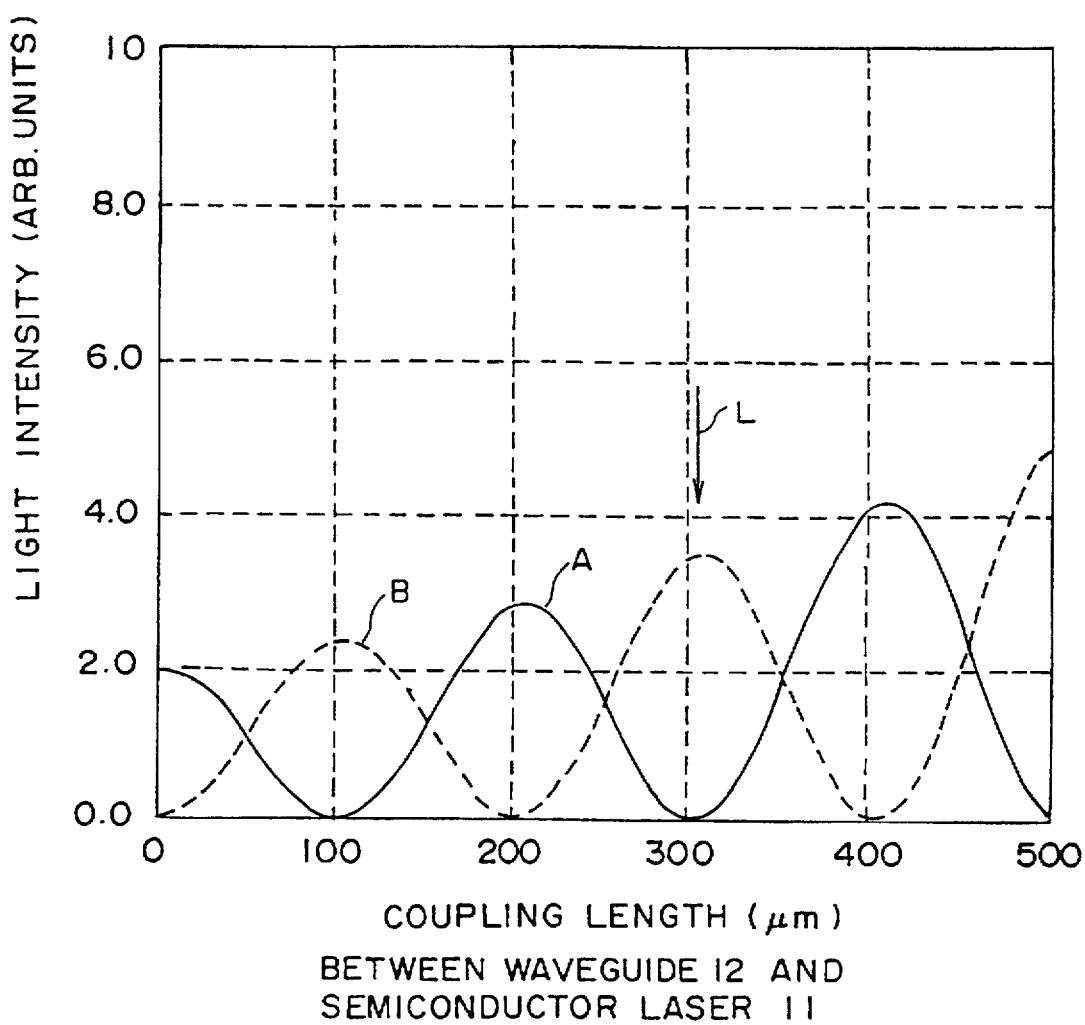
FIG. 4 is a graphical diagram to show a relation of light intensity versus coupling length in the integrated semiconductor laser apparatus shown in FIG. 1.

The coupling length L between the semiconductor laser 11 and the waveguide 12, that is, the resonator length was determined by numerical calculation. Specifically, as shown in FIG. 4, light intensity was obtained in the waveguide 12 and semiconductor laser 11 as changing the coupling length, and the coupling length L=303.1 μm, where the light in the semiconductor laser 11 is mode-transferred almost 100% to the waveguide 12, was determined as the coupling length between the semiconductor laser 11 and the waveguide 12 in the present embodiment. In FIG. 4, curve A indicates the light intensity in the semiconductor laser 11, and curve B the light intensity in the waveguide 12. In FIG. 4, the peak value of the light intensity in the waveguide 12 exponentially increases as approaching L=303.1 μm. The reason is that the effect of gain is taken into account for the semiconductor laser 11.

Next explained is the operation of the integrated semiconductor laser apparatus in Embodiment 1.

The semiconductor laser 11 is a laser of the pin structure. When an electric current is let to flow from the electrode 701 to the electrode 501, the current flows from the laser stripe portion 82 to the laser active layer 26 and further flows in the second cladding layer 25 in parallel with the surface of substrate 21. Then the current passes the impurity-doped area 301 to reach the electrode 501. This results in emitting light from the laser active layer 26, and the light travels back and forth in the resonator in the longitudinal direction (in the Z-axis direction) of the laser stripe portion 82.

Since the core layer 23 of the waveguide 12 located below the semiconductor laser 11 is placed in the evanescent-field area of the light propagating in the laser active layer 26, two modes appear so as to bridge the laser active layer 26 and the core layer 23. By interference between the two modes, optical power goes back and forth between the laser active layer 26 and the core layer 23. Since the present embodiment employs the coupling length L determined as shown in FIG. 4, the light transfers almost 100% to the waveguide 12 at the end of resonator of semiconductor laser 11.

In this manner the light transfers by evanescent-field coupling to the planar waveguide 12 below the laser 11, and the light propagates to the portion located below the laser stripe portion 82 in the waveguide 12. The light thus transferred propagates into the portion processed in the loaded form of the waveguide 12, and then is branched at a branching point 87 into two directions to further propagate.

The waveguide 12 has the non-doped upper first cladding layer 24 and the upper second cladding layer 25 doped n-type, as described above. Since the non-doped upper first cladding layer 24 is located on the side of core layer 23, the most light propagating in the waveguide 12 propagates in the low-carrier-concentration core layer 23 and upper first cladding layer 24. Accordingly, the rate of light absorbed by carriers is very low among the light propagating in the waveguide 12. Namely, the waveguide 12 can propagate the light with low losses, because the losses due to light absorption of carriers are very small.

Since the electrode 501 on the n-type side is located on the top surface side of substrate 21 where the electrode 701 on the p-type side is formed, mounting of wiring and routing of wiring to the electrodes 501, 701 can be carried out only on the top surface side of substrate 21. Namely, wiring can be done only on the top surface side without a need to lead wiring out from the bottom surface side of substrate 21, for example when the apparatus is mounted together with other circuit parts on an electric circuit board or the like. Thus, integration of the apparatus with other parts becomes easier.

Next explained referring to FIG. 2A to FIG. 4 is a process for fabricating the integrated semiconductor laser apparatus in Embodiment 1.

(1) As shown in FIG. 3, nine layers are first grown on the n-GaAs substrate 21 in the order of the lower cladding layer (non-doped) 22, the core layer (non-doped) 23, the upper first cladding layer (non-doped) 24, the upper second cladding layer ($n^-$-doped) 25, the laser active layer (non-doped) 26, the laser barrier layer ($p^-$-doped) 27, the laser guide layer ($p^-$-doped) 28, the laser cladding layer ($p^-$-doped) 29, and the laser cap layer ($p^+$-doped) 30.

(2) Next performed as shown in FIGS. 2A and 2E are etching of the laser stripe portion 82 for injection current narrowing of the semiconductor laser 11, and etching of the laser mesa area 81. Since formation of mirrors of resonator is also carried out at the same time as the etching of the laser stripe portion 82, RIE (Reactive Ion Etching), which is one of the dry etching processes, is applied herein. A gas used is a $BCl_3/Cl_2$-base mixture gas, the etching pressure is 25 mTorr, and RF power is 0.35 W/cm². This allows precision control of the etching rate to 38 angstrom/sec. thereby forming vertical end faces used as mirrors.

Of course, higher-precision end face formation is possible using RIBE (Reactive Ion Beam Etching) with a $Cl_2$-base gas. In the other etching step, no problem will arise when similar dry etching or $H_3PO_4$—$H_2O_2$—$H_2O$-base wet etching with less etching selectivity in the GaAs/AlGaAs system is carried out.

(3) Next formed as shown in FIGS. 2C and 2G is the n-type-impurity-doped area 301 for reducing contact resistance between the electrode 501 and the upper second cladding layer 25. The inventors employed the "open tube type diffusion process using silica thin film" [K. Okamoto et al.: Proceedings of 1st International Symposium on Control of Semiconductor Interfaces, p 525 (1994), ELSEVIER SCIENCE B. V.], and applied the rapid diffusion (RTA: Rapid Thermal Annealing) process. The thermal treatment at 850° C. for 10 minutes was carried out to form an area doped with the impurity of Sn in the surface concentration Cs: $1 \times 10^{18}$ $cm^{-3}$ and the diffusion depth Xj: about 0.3 µm.

(4) After that, as shown in FIGS. 2K and 2N, the upper first cladding layer 24 and upper second cladding layer 25 are etched in the shape shown in FIG. 1 in order to form the loaded waveguide 12.

(5) Further, the oxide film ($SiO_2$ film) 86 is formed over the entire device surface by the plasma CVD process or the like, an Au-Ge layer to be contact hole 95 and n-type electrode 501 is formed by vacuum vapor deposition, and it is patterned in the desired shape of electrode 501 (FIGS. 2D and 2H).

(6) For flattening the device and terminating the etching ends, a coating of polyimide 601 is formed over the entire device surface and then is cured under necessary conditions to end imide formation. After that, the polyimide layer is etched back by plasma etching using a $CF_4/O_2$-base gas to expose the top surface of the outermost layer part of laser, and the oxide layer 86 thus exposed is etched off with buffer hydrofluoric acid to expose the laser cap layer 30 (FIGS. 2I and 2L).

(7) An Au—Zn layer is vapor-deposited as the p-type electrode 701 on the laser cap layer 30 exposed, and then is patterned in the shape of electrode 701 (FIGS. 2J and 2M).

(8) Plasma etching using a $CF_4/O_2$-base gas is finally carried out to expose the n-type grounded electrode 501, thus completing the device (FIGS. 2K and 2N).

Since the process for fabricating the integrated semiconductor laser apparatus in the above embodiment includes only one epitaxial step as described above, it has advantages of very high working efficiency and high yield.

Embodiment 2

Next explained is another integrated semiconductor laser apparatus according to Embodiment 2 of the present invention.

FIG. 5 is a plan view to show the integrated semiconductor laser apparatus according to Embodiment 2 of the present invention, and FIGS. 6A–6D are sectional views taken along VI–VI' line, of the integrated semiconductor laser apparatus shown in FIG. 5. In these drawings, the semiconductor laser 11 and Y-branched waveguide 12 are formed on the substrate 21. Specifically, as shown in FIG. 2K, the waveguide 12 is provided on the substrate 21, and the semiconductor laser 11 is formed on the waveguide 12.

The integrated semiconductor laser apparatus described in Embodiment 1 is the Fabry-Perot laser, whereas the integrated semiconductor laser apparatus shown in FIG. 5 is a DFB (distributed feedback) type laser for the main purposes to achieve narrow linewidth of oscillation wavelength and to suppress wavelength fluctuations due to temperature. The waveguide 12 is shaped in a planar waveguide below the semiconductor laser 11 and in a loaded single-mode waveguide, in which cladding is processed in the waveguide shape as shown in FIG. 2N, in the other portions than below the semiconductor laser 11. The semiconductor laser 11 and waveguide 12 are arranged so as to be coupled with each other by evanescent-field coupling.

The detailed structure of the waveguide 12 is the same as that in Embodiment 1, and description thereof is omitted herein.

The semiconductor laser 11 has a periodic diffraction grating because it is the DFB laser. In the integrated semiconductor laser of FIG. 5, the laser guide layer 28 located below the laser stripe portion 82 is processed in the shape of diffraction grating 93, thus forming a diffraction-grating-formed layer (FIG. 6C).

Further, the end faces 94 of the laser mesa area 81 are not etching mirrors normal to the traveling direction of light, but are end faces inclined 7° relative to the direction normal to the traveling direction of light. The reason is to prevent the end faces 94 from forming the resonator structure, thus in turn preventing oscillation in the Fabry-Perot mode.

The structure of the semiconductor laser 11 except for the above is the same as that in Embodiment 1, and description is omitted herein.

Next explained is the operation of the integrated semiconductor laser apparatus in Embodiment 2.

The semiconductor laser 11 is the DFB laser. When an electric current is let to flow from the electrode 701 to the electrode 501, the current flows from the laser stripe portion 82 to the laser active layer 26 and further flows in the second cladding layer 25 in parallel with the surface of substrate 21 then to travel through the impurity-doped area 301 to reach the electrode 501. This generates light from the laser active layer 26. The light travels back and forth with distributed feedback in the longitudinal direction (in the Z-axis direction) of the laser stripe portion 82. This light is of a single mode, having a narrow spectral width and small wavelength fluctuations.

Since the core layer 23 of the waveguide 12 located below the semiconductor laser 11 is located in the evanescent-field area of the light traveling in the laser active layer 26 in this arrangement, as explained in Embodiment 1, two modes appear as bridging the laser active layer 26 and the core layer 23. Based on interference between the two modes, optical power goes back and forth between the laser active layer 26 and the core layer 23. In the present embodiment, the coupling length L is set to the optimal value, and the light transfers almost 100% to the waveguide 12 at the end of laser 11. Thus, the light transfers by evanescent-field coupling to the planar waveguide 12 below the laser 11, and the light travels in the portion located below the laser stripe portion 82 in the waveguide 12. The light transferred goes into the portion processed in the loaded form of waveguide 12 to propagate therein and then to be branched at the branching point 87 into two directions to further propagate therein.

The waveguide 12 has the non-doped upper first cladding layer 24 and the upper second cladding layer 25 doped n-type, as explained in Embodiment 1. Here, since the non-doped upper first cladding layer 24 is located on the side of core layer 23, the most light propagating in the waveguide 12 propagates in the low-carrier-concentration core layer 23 and upper first cladding layer 24. Accordingly, the rate of light absorbed by carriers is very low among the light propagating in the waveguide 12. Namely, because the waveguide 12 has very small losses due to light absorption of carriers, the light with narrow spectral width emitted from the semiconductor laser 11 can propagate with small losses in the waveguide 12.

Since the electrode 501 on the n-type side is located on the top surface side of substrate 21 where the electrode 701 on the p-type side is formed, the present embodiment is good in working efficiency of wiring and routing of wiring and easy in integration with other parts, similarly as Embodiment 1 was.

Next explained referring to FIGS. 2A–2N and FIGS. 6A–6D is a process for fabricating the integrated semiconductor laser apparatus in Embodiment 2.

(1) First grown in first epitaxy on the n-GaAs substrate 21 are, as shown in FIG. 6A, the lower cladding layer (non-doped) 22, the core layer (non-doped) 23, the upper first cladding layer (non-doped) 24, the upper second cladding layer ($n^-$-doped) 25, the laser active layer (non-doped) 26, the laser barrier layer ($p^-$-doped) 27, and the laser guide layer ($p^-$-doped) 28.

Figure 7A:
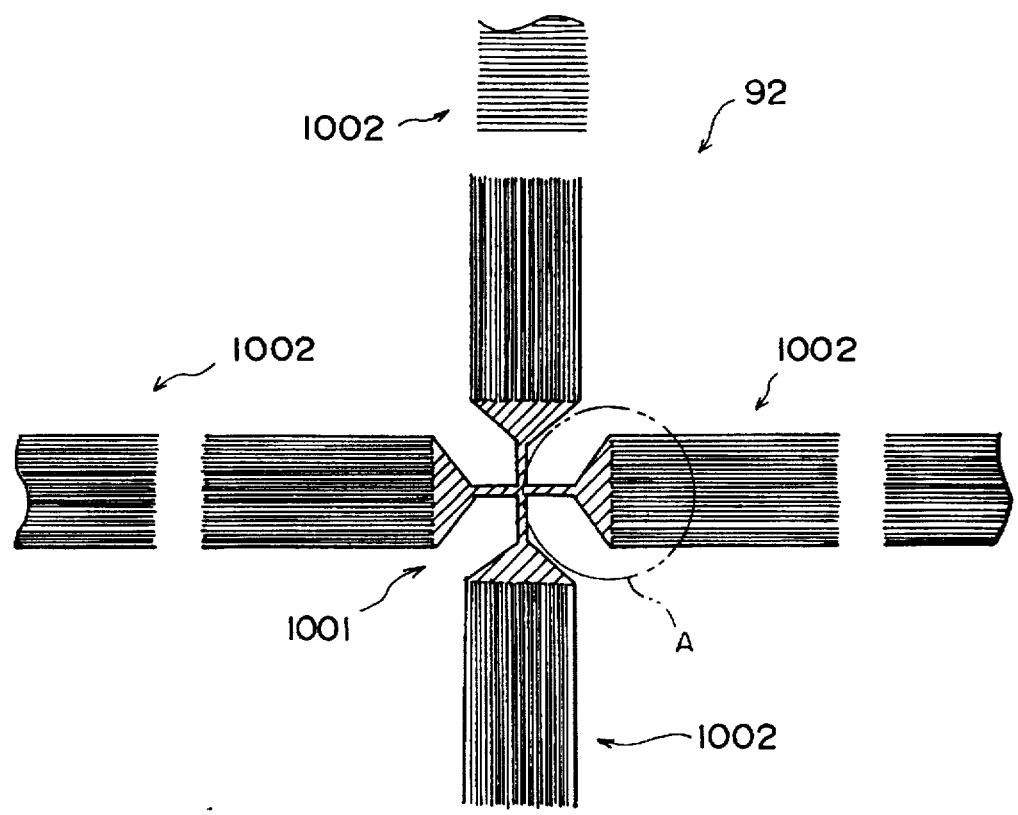
FIGS. 7A and 7B are plan views to show the shape of an alignment mark.
Figure 7B:
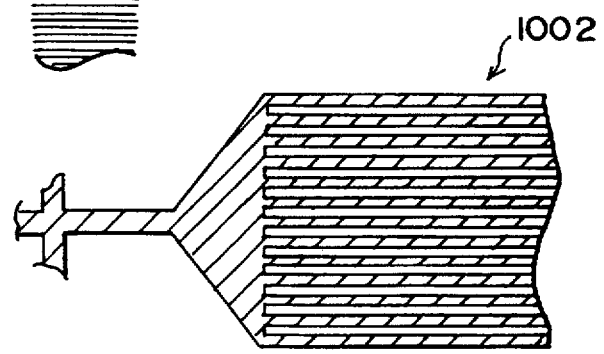

Alignment marks 91, 92 are next formed (FIG. 6B). The alignment mark 91 is a cross mark made of a $SiO_2$ film. The alignment mark 92 is a mark formed of projections and depressions in the form shown in FIG. 7A. FIG. 7B is an enlarged view of part A in FIG. 7A. In the present embodiment, the alignment mark 92 was formed by recessing portions corresponding to the hatched portions shown in FIGS. 7A and 7B in the surface of the laser guide layer 28. Specifically, a cross main mark 1001 is formed of crossing lines in the line width of 2 μm in the center, and four submarks 1002 are formed of 2 μm line-and-space patterns consisting of horizontal lines and vertical lines around the main mark 1001. Particularly, at least one of the submarks 1002 is formed longer than about 1 mm. Fabrication of the alignment mark 92 was carried out by normal photolithography and etching. Of course, the photolithography may be replaced by electron beam lithography.

Next, the diffraction grating 93 is formed in the laser guide layer 28 (FIG. 6C). A method for forming the diffraction grating is conceivably ordinary double-beam interference exposure lithography, but in the present embodiment the periodic diffraction grating (in the period 0.06 μm) was formed by an electron beam lithography using a chemical-amplification negative type resist, investigated by the inventors (for example, K. Okamoto et al.; Annual Report of Engineering Research Institute, Univ. of Tokyo, 53 (1994) 105). Since this process uses the negative resist, desired patterning is possible at desired positions, and high-speed lithography is possible utilizing the chemical amplification effect. Further, a property of plasma etching resistance is also good.

Alignment for determining a position for lithography with electron beam is carried out using the alignment mark 92 as observing the surface of the laser guide layer 28 with SEM (scanning electron microscope). Since the alignment mark 92 in the shape of FIG. 7A emits a lot of secondary electrons from step edges of the submarks 1002 having the periodic line-and-space patterns upon observation with SEM, an SEM image is an image with high contrast even at low magnification.

Accordingly, an operator can easily find existence of the submarks 1002 from in the wide sample substrate in observation of SEM image at low magnification. Once the operator finds a position of a submark 1002, the operator can easily find out the position of main mark 1001 from the shape of the submark 1002. Then the operator observes the main mark 1001 at high magnification and determines a position to be irradiated with electron beam for formation of the diffraction grating 93 with a mark reference position at the intersecting point of the crossing lines then to input it into the electron beam lithography apparatus. As explained above, manual alignment of the electron beam lithography position can be carried out very easily and at high accuracy by using the alignment mark shown in FIG. 7A. The diffraction grating 93 is formed by this electron beam lithography.

After that, second epitaxy is effected by liquid phase epitaxy (LPE) or metal organic vapor phase epitaxy to form the laser cladding layer ($p^-$-doped) 29 and the laser cap layer ($p^+$-doped) 30 (FIG. 6D). The diffraction grating area becomes completely buried by this epitaxy. The alignment mark 92 is also buried on this occasion, but no crystal grows on the alignment mark 91 of $SiO_2$. Thus, the alignment mark 91 can be observed from the top thereof after second epitaxy.

(2) Next carried out as shown in FIGS. 2A and 2C are etching of the laser stripe portion 82 for injection current narrowing of the semiconductor laser 11, and etching of the laser mesa area 81. In the exposure step of a resist in the etching step, alignment of a photomask is carried out using the alignment mark 91. Since formation of the end faces 94, inclined 7°, of the mesa area 81 is also carried out at the same time as etching of the laser stripe portion 82, the present embodiment employs RIE (Reactive Ion Etching), which is one of the dry etching processes. A gas used is a $BCl_3/Cl_2$-base mixture gas, and the etching pressure is 25 mTorr and the RF power is 0.35 W/cm$^2$. This permits precision control of the etching rate to 38 angstrom/sec, thereby enabling to form the end faces inclined 7°.

After that, the same processes as the fabrication step (3) and the following steps in Embodiment 1 are carried out to fabricate the integrated semiconductor laser apparatus shown in FIG. 5.

Figure 8:
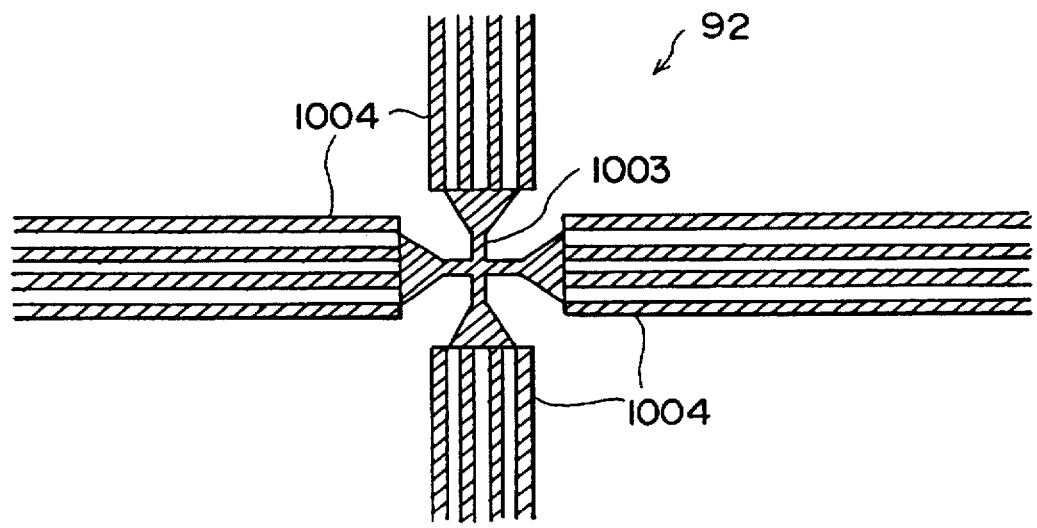
FIG. 8 is a plan view to show the shape of another alignment mark.
Figure 9:
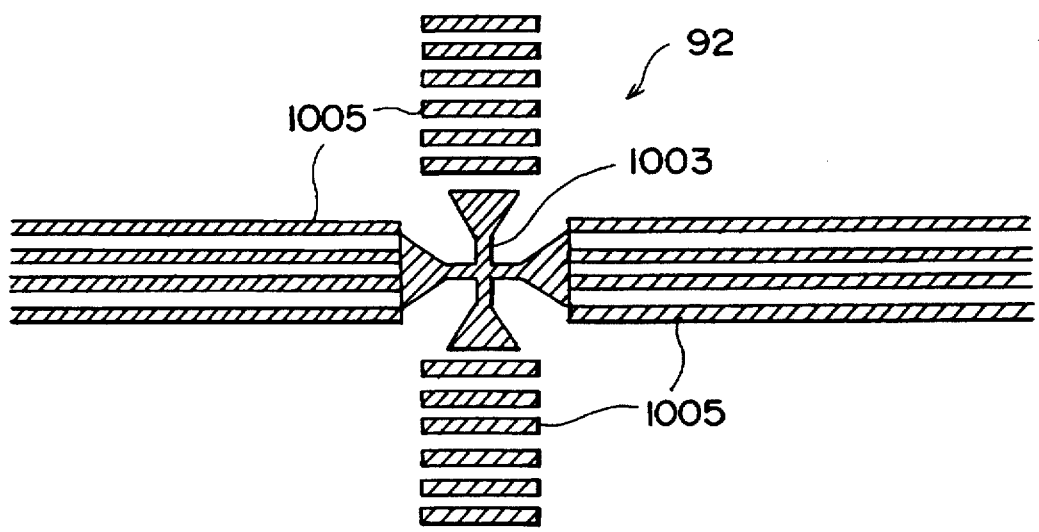
FIG. 9 is a plan view to show the shape of another alignment mark.
Figure 10:
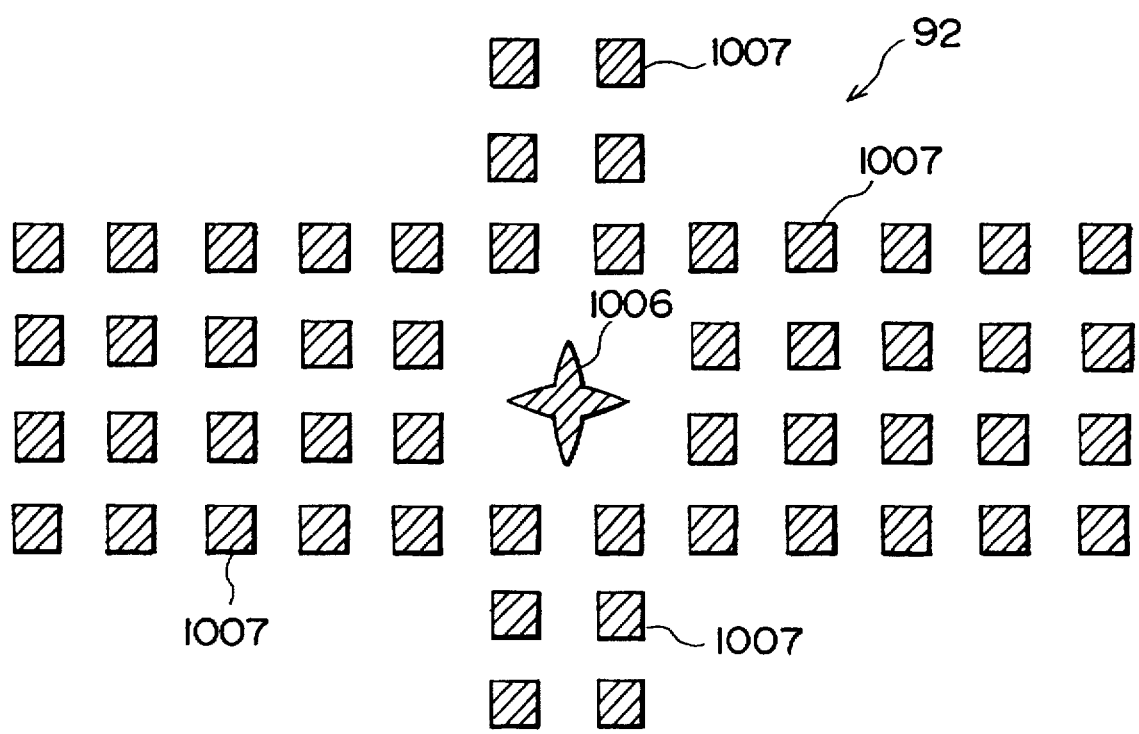
FIG. 10 is a plan view to show the shape of another alignment mark.

The alignment mark 92 may be either one of marks shaped as shown in FIG. 8, FIG. 9, and FIG. 10. In the case of such shapes, the position of alignment mark 92 can also readily be found in the SEM image similarly as in the case of the alignment mark of FIG. 7A. FIG. 8 shows an alignment mark comprised of a cross main mark 1003 having crossing lines of line width 2 μm in the center and four submarks 1004 composed of lines in 2 μm line-and-space patterns around the main mark. FIG. 9 shows an alignment mark in a shape similar to FIG. 8, but the submarks 1005 are line-and-space patterns all aligned in one direction. An alignment mark of FIG. 10 consists of a star main mark 1006 8 μm high and wide located in the center and submarks 1007 formed in patterns 3 μm square at intervals of 6 μm and disposed around the main mark.

Since the process for fabricating the integrated semiconductor laser of FIG. 5 as described above can fabricate the DFB laser by the two epitaxial processes, the working efficiency and yield are very high.

Additionally, in a process of electron beam lithography, a position to be irradiated with electron beam can easily be found from SEM image by using the alignment mark 92 where a plurality of projections and depressions are arranged to a predetermined direction. Therefore, the diffraction grating 93 can be formed with high precision.

In the above-mentioned two embodiments, described examples are related to a semiconductor laser integrated with the simplest Y-branched waveguide. However, the above structure and manufacturing method can be applied to the case where other optical devices (such as phase modulator and the like) are integrated by only modifying a layout of the waveguide.

Further, Embodiment 2 may be modified in such a manner that an antireflection film is formed on the end faces instead of inclining the end faces 92 of the semiconductor laser 7°.

Embodiment 3

Figure 11:
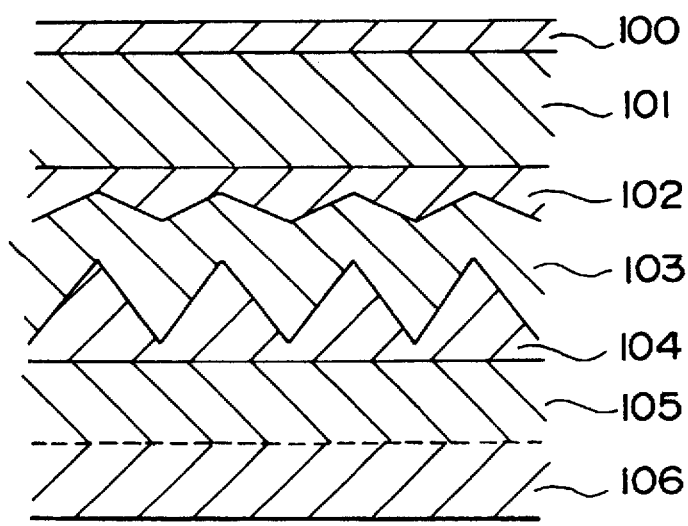
FIG. 11 is a sectional view of major part to show another integrated semiconductor laser apparatus according to Embodiment 3 of the present invention.
Figure 12A:
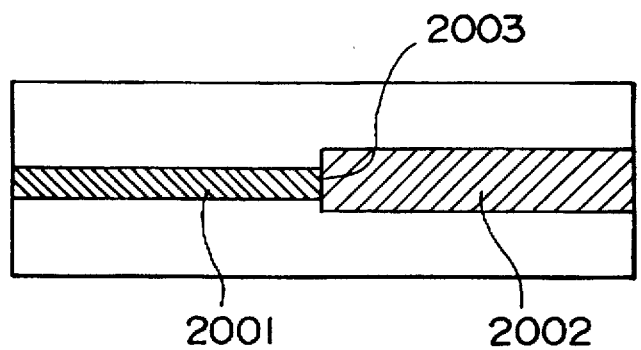
FIGS. 12A to 12C are explanatory drawings to show the conventional coupling methods for coupling between the laser active layer and the waveguide layer.
Figure 12B:
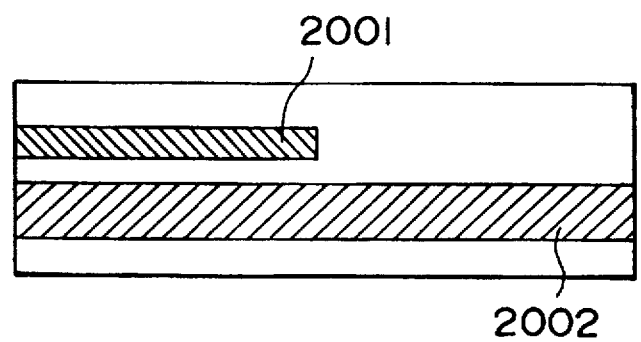
Figure 12C:
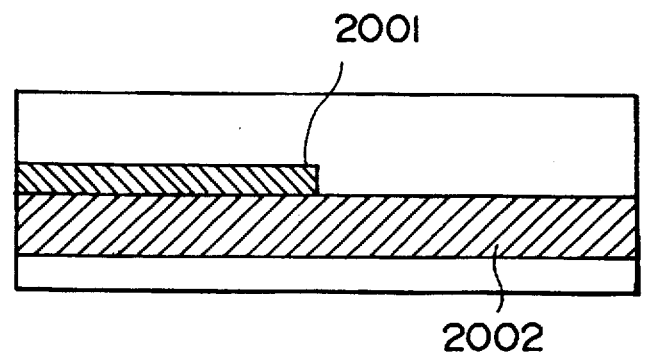
Figure 13:
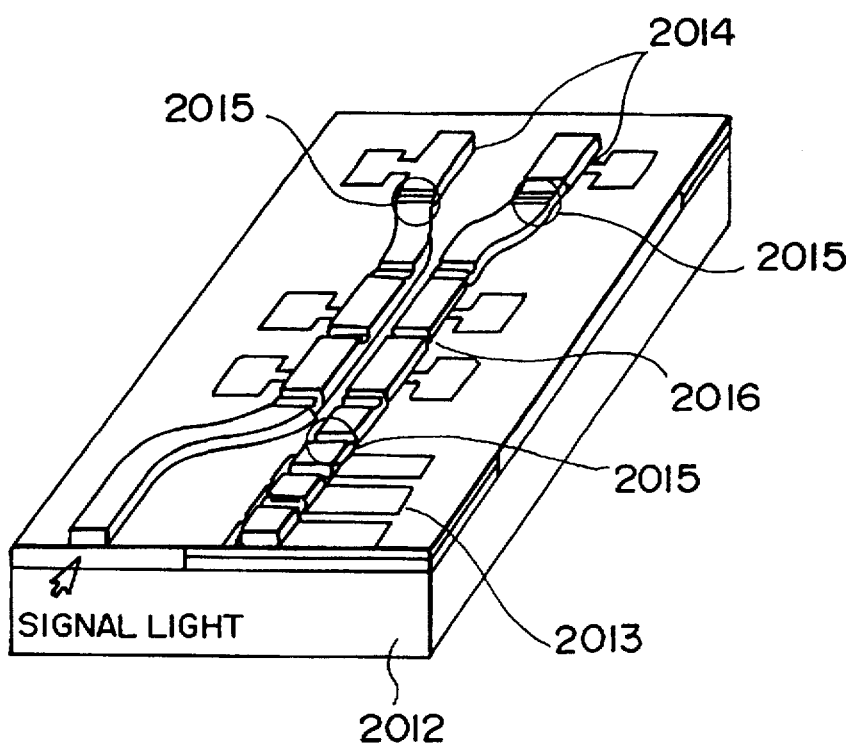
FIG. 13 is a perspective view to show the conventional optical integrated device.

FIG. 11 is a sectional view of major part to show another integrated semiconductor laser apparatus according to Embodiment 3 of the present invention, and the structure of the entire apparatus is fundamentally the same as that of FIG. 5 in Embodiment 2. Embodiment 2 described the so-called index coupling type laser wherein light feedback of DFB laser is effected through a periodic change of refractive index, whereas the present embodiment describes a gain coupling type laser using a periodic change of gain.

There are various structures for the index coupling type laser (for example, Y. Luo et al.: Appl. Phys. Lett. 56 (1990) 1620), and the integrated laser part of the laser apparatus according to the present invention can be applied to any of the structures.

In the drawing, in order from the top there are a contact layer 100, a third cladding layer 101, an active layer 102, a buffer layer 103, a pattern-formed layer 104, a second cladding layer 105, and a first cladding layer 106 formed in the laser area.

As illustrated, because periodic projections and depressions are formed in the active layer 102 itself, a periodic change is given to the magnitude of gain which the guided light obtains from the active layer 102. Gain coupling occurs accordingly. An index coupling component simultaneously generated by the projections and depressions of the active layer 102 can be canceled if conditions match, because the pattern-formed layer 104 formed through the buffer layer 103 immediately below the active layer 102 is a transparent diffraction grating with an inverted phase.

When the present invention is applied to such gain coupling type lasers, excellent monochromaticity and high side mode depression ratio can be achieved even if there exists reflection by cleaved end faces. Accordingly, it becomes possible to construct an integrated semiconductor laser apparatus excellent in tolerance against reflected return light from various devices.

As detailed above, the integrated semiconductor laser apparatus of the present invention can couple the light radiated to the waveguide by evanescent-field coupling at high efficiency and can propagate the light with small losses as suppressing absorption by carriers.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.7741/1995 filed on Jan. 20, 1995 is hereby incorporated by reference.

What is claimed is:

1. An integrated semiconductor laser apparatus comprising:

an active layer for radiating light;

a core layer for propagating light radiated in said active layer;

a first cladding layer disposed between said active layer and said core layer and in the proximity of said core layer;

a second cladding layer disposed between said active layer and said first cladding layer, and a pair of electrodes for producing an electric current flow in said active layer;

wherein said core layer is located in the proximity of the active layer so as to be in an evanescent-field area of the light radiating in said active layers and wherein a carrier concentration of said second cladding layer is higher than a carrier concentration of said first cladding layer.

2. The integrated semiconductor laser apparatus according to claim 1, wherein a distance between the active layer and the core layer is within 2 μm.

3. The integrated semiconductor laser apparatus according to claim 1, wherein the carrier concentration of the second cladding layer is in the range of $1\times10^{17}$ cm$^{-3}$ to $1\times10^{18}$ cm$^{-3}$.

4. The integrated semiconductor laser apparatus according to claim 1, wherein a first electrode of said pair of electrodes is located in a part of the second cladding layer.

5. The integrated semiconductor laser apparatus according to claim 4, wherein an impurity diffusion area is formed in the part of the second cladding layer where the first electrode is located.

6. The integrated semiconductor laser apparatus according to claim 4, further comprising:

a third cladding layer located so that the active layer is placed between the second cladding layer and said third cladding layer; and a second electrode of said pair of electrodes located so that said third cladding layer is placed between said active layer and said second electrode, wherein the first electrode and the second electrode are arranged in a lateral direction to each other.

7. The integrated semiconductor laser apparatus according to claim 1, wherein end faces of the active layer are formed in a mirror form perpendicular to a traveling direction of the light radiating in the active layer.

8. The integrated semiconductor laser apparatus according to claim 1, wherein an area in which the active layer is not formed in said first and second cladding layers is structured as a waveguide.

9. An integrated semiconductor laser apparatus comprising:

an active layer for radiating light;

a core layer for propagating light radiated in said active layer;

a first cladding layer disposed between said active layer and said core layer and in the proximity of said core layer;

a second cladding layer disposed between said active layer and said first cladding layer;

a first electrode located in a part of said second cladding layer;

a third cladding layer located so that said active layer is placed between said second cladding layer and said third cladding layer;

a second electrode located so that said third cladding layer is placed between said active layer and said second electrode; and a diffraction-grating-formed layer located between said active layer and said third cladding layer, wherein said core layer is located in the proximity of the active layer so as to be in an evanescent-field area of the light radiating in said active layer, wherein a carrier concentration of said second cladding layer is higher than a carrier concentration of said first cladding layer, and wherein the first electrode and second electrode are arranged in a lateral direction to each other.

10. The integrated semiconductor laser apparatus according to claim 9, wherein end faces of the active layer are formed so as not to be perpendicular to a traveling direction of the light radiating in the active layer to prevent oscillation in the Fabry-Perot mode.

11. The integrated semiconductor laser apparatus according to claim 9, wherein an area in which the active layer is not formed in said first and second cladding layers is structured as a waveguide.

12. An integrated semiconductor laser apparatus comprising:

an active layer for radiating light;

a core layer for propagating the light radiated in said active layer;

a first cladding layer disposed between said active layer and said core layer and in the proximity of said core layer;

a second cladding layer disposed between said active layer and said first cladding layer;

a pair of electrodes for producing an electric current flow in said active layer; and a pattern-formed layer located between said active layer and said second cladding layer, wherein said core layer is located in the proximity of the active layer so as to be in an evanescent-field area of the light radiating in said active layer, and wherein a carrier concentration of said second cladding layer is higher than a carrier concentration of said first cladding layer.

13. The integrated semiconductor laser apparatus according to claim 12, wherein an area in which the active layer is not formed in said first and second cladding layers is structured as a waveguide.

* * * * *